US009673085B2

(12) United States Patent
Aga et al.

(10) Patent No.: US 9,673,085 B2
(45) Date of Patent: Jun. 6, 2017

(54) METHOD FOR MANUFACTURING SOI WAFER

(71) Applicant: SHIN-ETSU HANDOTAI CO., LTD., Tokyo (JP)

(72) Inventors: Hiroji Aga, Takasaki (JP); Toru Ishizuka, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/419,357

(22) PCT Filed: Jul. 30, 2013

(86) PCT No.: PCT/JP2013/004600
§ 371 (c)(1),
(2) Date: Feb. 3, 2015

(87) PCT Pub. No.: WO2014/034019
PCT Pub. Date: Mar. 6, 2014

(65) Prior Publication Data
US 2015/0206790 A1 Jul. 23, 2015

(30) Foreign Application Priority Data

Sep. 3, 2012 (JP) .................. 2012-193578

(51) Int. Cl.
H01L 21/762 (2006.01)
H01L 21/265 (2006.01)
H01L 21/311 (2006.01)
(52) U.S. Cl.
CPC .. H01L 21/76254 (2013.01); H01L 21/26533 (2013.01); H01L 21/31105 (2013.01)

(58) Field of Classification Search
CPC .................. H01L 21/76254; H01L 21/31105
See application file for complete search history.

(56) References Cited

U.S. PATENT DOCUMENTS

2004/0219370 A1    11/2004  Aga et al.
2007/0054459 A1    3/2007   Aga et al.
(Continued)

FOREIGN PATENT DOCUMENTS

CN    1744298 A     3/2006
CN    101124657 A   2/2008
(Continued)

OTHER PUBLICATIONS

Nov. 12, 2013 International Search Report issued in International Application No. PCT/JP2013/004600.
(Continued)

Primary Examiner — Kimberly Rizkallah
Assistant Examiner — Mounir Amer
(74) Attorney, Agent, or Firm — Oliff PLC

(57) ABSTRACT

The present invention provides a method for manufacturing an SOI wafer including a step of forming an insulator film on an entire surface of a bond wafer before bonding, bringing a bonded wafer before delaminating the bond wafer at an ion implanted layer into contact with a liquid that enables dissolving the insulator film while protecting the insulator film on a back surface on the opposite side of a bonding surface of the bond wafer, or exposing the bonded wafer to a gas that enables dissolving the insulator film, and thus etching the insulator film placed between the bond wafer and a base wafer from an outer peripheral end of the bonded wafer toward a center of the bonded wafer.

11 Claims, 3 Drawing Sheets

(56) References Cited

U.S. PATENT DOCUMENTS

2008/0315349 A1    12/2008   Takei et al.
2009/0095399 A1     4/2009   Zussy et al.
2009/0117706 A1     5/2009   Soeta et al.
2011/0281420 A1    11/2011   Aga et al.
2013/0078785 A1     3/2013   Zussy et al.

FOREIGN PATENT DOCUMENTS

| CN | 101151708 A | 3/2008 |
|---|---|---|
| EP | 1914799 A1 | 4/2008 |
| EP | 2149898 A1 | 2/2010 |
| JP | H08107091 A | 4/1996 |
| JP | 2002305292 A | 10/2002 |
| JP | 2004022838 A | 1/2004 |
| JP | 2006216662 A | 8/2006 |
| JP | 2006270039 A | 10/2006 |
| JP | 2008526038 A | 7/2008 |
| JP | 4398934 B2 | 1/2010 |
| JP | 2010199353 A | 9/2010 |
| JP | 2011071193 A | 4/2011 |

OTHER PUBLICATIONS

Mar. 31, 2016 Extended Search Report issued in European Patent Application No. 13833542.7.
Jul. 4, 2016 Office Action issued in Chinese Application No. 201380045827.8.
Feb. 21, 2017 Office Action issued in Chinese Patent Application No. 201380045827.8.

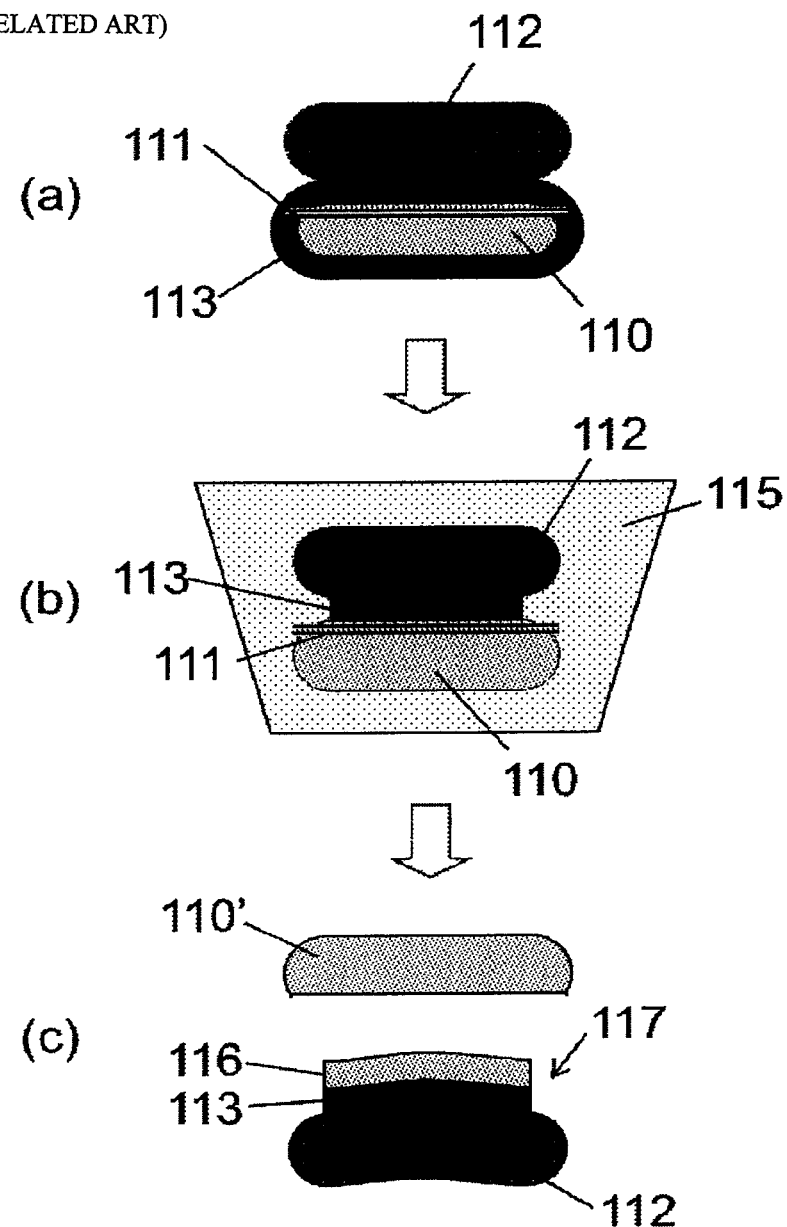

METHOD FOR MANUFACTURING SOI WAFER

TECHNICAL FIELD

The present invention relates to a method for manufacturing an SOI wafer by an ion implantation delamination method.

BACKGROUND ART

In conventional examples, at an outer peripheral portion of an SOI wafer fabricated by the ion implantation delamination method, an SOI layer is not transferred, and a terrace where a base wafer surface is exposed is formed. A main cause thereof is that bonding force between bonded wafers is weak since flatness of the wafers becomes poor due to polishing sag at a wafer outer peripheral portion and the SOI layer is hardly transferred to the base wafer side.

Observing a terrace portion of this SOI wafer with the use of an optical microscope, an SOI island that the SOI layer is isolated in an island shape is observed at a boundary between the SOI layer and the terrace portion. It can be considered that the SOI island is generated in a transitional region of flatness that allows transfer of the SOI layer and flatness that does not allow transfer of the same. There is concern that such an SOI island delaminates from a wafer during a device fabrication process, turns to a silicon particle to again adhere to a device fabrication region, and causes a device failure (Patent Literature 1).

Further, in the ion implantation delamination method, since a width of the terrace portion (a terrace width) is determined based on flatness of the terrace portion of a wafer to be bonded, controlling the terrace width after bonding is difficult. For example, in case of creating a laser mark or the like on the terrace portion of the SOI wafer in a device process, there is concern that the laser mark cannot be created when the terrace width is too small.

As a method for improving such an SOI island and controlling a terrace width, there is a method for immersing a wafer subjected to bonding in an HF containing aqueous solution and etching an insulator film placed between a bond wafer and a base wafer from an outer periphery (Patent Literature 2).

CITATION LIST

Patent Literatures

Patent Literature 1: Japanese Unexamined Patent Publication (Kokai) No. 2002-305292
Patent Literature 2: Japanese Unexamined Patent Publication (Kokai) No. 2010-199353
Patent Literature 3: Japanese Unexamined Patent Publication (Kokai) No. 2006-216662
Patent Literature 4: Japanese Translation of PCT International Application Publication (Kokai) No. 2008-526038
Patent Literature 5: Japanese Unexamined Patent Publication (Kokai) No. 2006-270039

SUMMARY OF INVENTION

Technical Problem

For example, when a bonded wafer having an insulator film formed on an entire surface of a bond wafer is used and an SOI island at a terrace portion is improved by the method described in Patent Literature 2, the insulator film formed on portions other than bonding surfaces of the bond wafer and a base wafer is also removed. Since the bond wafer after delamination still has a flat shape since the insulator film has been removed therefrom, but an SOI wafer after delamination warps since the insulator film is present on the bonding surface thereof. The warp occurs due to a difference in thermal expansion coefficient between the insulator film and silicon, and the SOI wafer has a convex shape on the SOI layer side when the insulator film is an oxide film in particular. The warp due to this insulator film increases in proportion to a film thickness of the insulator film.

As described above, the present inventors have discovered that, since the bond wafer after delamination has the flat shape while the SOI wafer has the convex shape on the SOI layer side, a tip portion of the convex shape of the SOI wafer comes into contact with the bond wafer and a problem of scratches or an abnormality in SOI film thickness distribution occurs.

Patent Literature 3 describes that, to avoid an SOI island at a terrace portion of an SOI wafer based on the ion implantation delamination method, an outer peripheral portion of an oxide film formed on a bond wafer or a base wafer before bonding is removed in advance and then bonding is carried out. However, Patent Literature 3 has a drawback that the outer peripheral portion of the oxide film is removed before bonding and this removal process is complicated.

Further, a technology disclosed in Patent Literature 4 is the same as Patent Literature 2 in that an oxide film is removed in a bonded state, but a method for removing the oxide film is different since it is a pretreatment called trimming for etching silicon. Furthermore, there is no description concerning an SOI island that is a problem intrinsic to the ion implantation delamination method.

Moreover, as a method for removing an oxide film on a front surface side alone of an SOI wafer without removing an oxide film on a back surface side of a base wafer, there is a method using spin etching disclosed in Patent Literature 5.

However, even if the spin etching is applied to the SOI wafer after delamination, an SOI island at a terrace portion cannot be reduced, and an outer peripheral end of an SOI layer is changed into an overhang shape due to etching from a buried oxide film end face and is prone to be delaminated.

In view of the above-described problems, it is an object of the present invention to provide a method for manufacturing an SOI wafer, which can control a width of a terrace, prevent occurrence of an SOI island, and suppress scratches and an abnormality in SOI film thickness at the time of forming an insulator film on a bond wafer and performing bonding.

Solution to Problems

To achieve the object, the present invention provides a method for manufacturing an SOI wafer, by which at least one type of gas ion selected from a hydrogen ion and a rare gas ion is ion-implanted into a silicon single crystal bond wafer from a surface thereof to form an ion implanted layer, an ion implanted surface of the bond wafer is bonded to a surface of a base wafer through an insulator film, and then the bond wafer is delaminated at the ion implanted layer to fabricate an SOI wafer, wherein the method includes a step of forming the insulator film on at least an entire surface of the bond wafer before the bonding, bringing a bonded wafer before delaminating the bond wafer at the ion implanted layer into contact with a liquid that enables dissolving the insulator film or exposing the same to a gas that enables dissolving the insulator film while protecting the insulator film on a back surface on the opposite side of a bonding surface of the bond wafer, and thus etching the insulator film placed between the bond wafer and the base wafer from an outer peripheral end of the bonded wafer toward a center of the same.

As described above, when the insulator film placed between the bond wafer and the base wafer is etched from the outer peripheral end of the bonded wafer toward the center, a terrace width after the delamination can be controlled, and occurrence of an SOI island that is a defect intrinsic to the ion implantation delamination method can be avoided. At the same time, when the insulator film on the back surface of the bond wafer is protected at the time of etching the insulator film, the delaminated bond wafer can be warped so that a delamination surface side thereof has a concave shape with respect to the SOI wafer that warps into a convex shape on the SOI layer side (the delamination surface side) after the delamination. As a result, contact of a flat bond wafer and a convex SOI wafer due to a mismatch of shapes like conventional examples can be avoided, and scratches on the SOI wafer after the delamination and an abnormality in SOI film thickness distribution can be suppressed.

In the method, it is preferable to bond the bond wafer and the base wafer at a room temperature, and then the insulator film is etched without performing a heat treatment.

As described above, when the insulator film is etched without performing a heat treatment, the bond wafer can be prevented from being delaminated at an ion implanted layer before the etching of the insulator film, the terrace width can be more accurately controlled, and occurrence of the SOI island can be avoided.

Alternatively, the bond wafer and the base wafer can be bonded at a room temperature, then a low-temperature heat treatment that does not allow delamination at the ion implanted layer can be carried out, and thereafter the insulator film can be etched.

As described above, according to the low-temperature heat treatment, bonding strength can be improved while preventing the bond wafer from being delaminated, the terrace width can be more accurately controlled, and occurrence of the SOI island can be avoided.

Further, it is preferable to etch the insulator film until it reaches a position that is 0.3 mm to 10 mm from the outer peripheral end of the bonded wafer toward the center.

When the insulator film is etched in such a range, a proper terrace width can be provided in case of fabricating a laser mark or the like on the terrace portion in a device process, and occurrence of the SOI island can be assuredly avoided.

Furthermore, it is preferable that a range where the insulator film on the back surface of the bond wafer on the opposite side of the bonding surface of the same is protected in the etching of the insulator film is a region inside a position that is 0 mm to 75 mm from the outer peripheral end of the bond wafer toward the center.

When such a range is protected, the bond wafer after the delamination can be further assuredly warped, and scratches on the SOI wafer after the delamination and an abnormality in SOI film thickness distribution can be more effectively suppressed.

At this time, it is preferable to protect the insulator film on the back surface of the bond wafer on the opposite side of the bonding surface of the same by using an O-ring.

When such an O-ring is used, the insulator film on the back surface of the bond wafer can be assuredly protected by the simple method.

Moreover, it is preferable to use the insulator film that is an oxide film, a nitride film, or a laminated film of these films.

Such an insulator film can be easily formed by a heat treatment or CVD.

Additionally, it is preferable to immerse the bonded wafer having the insulator film subjected to etching in a liquid that enables dissolving single crystal silicon or expose the same to a gas that enables dissolving the single crystal silicon, thereby etch an outer peripheral portion of the bond wafer to at least a depth of the ion implanted layer from the bonding surface side of the bond wafer, and then delaminate the bond wafer.

Such Si etching enables removing a portion that can serve as a foreign matter in a device fabrication process in advance.

Advantageous Effects of Invention

As described above, according to the present invention, at the time of forming the insulator film on the bond wafer and performing bonding to manufacture the SOI wafer, the width of the terrace can be controlled, occurrence of the SOI island can be avoided, and scratches on the SOI wafer after delamination and an abnormality in SOI film thickness distribution can be suppressed.

BRIEF DESCRIPTION OF DRAWINGS

FIG. 3 is a flowchart of a conventional method for manufacturing an SOI wafer.

DESCRIPTION OF EMBODIMENTS

Figure 1:
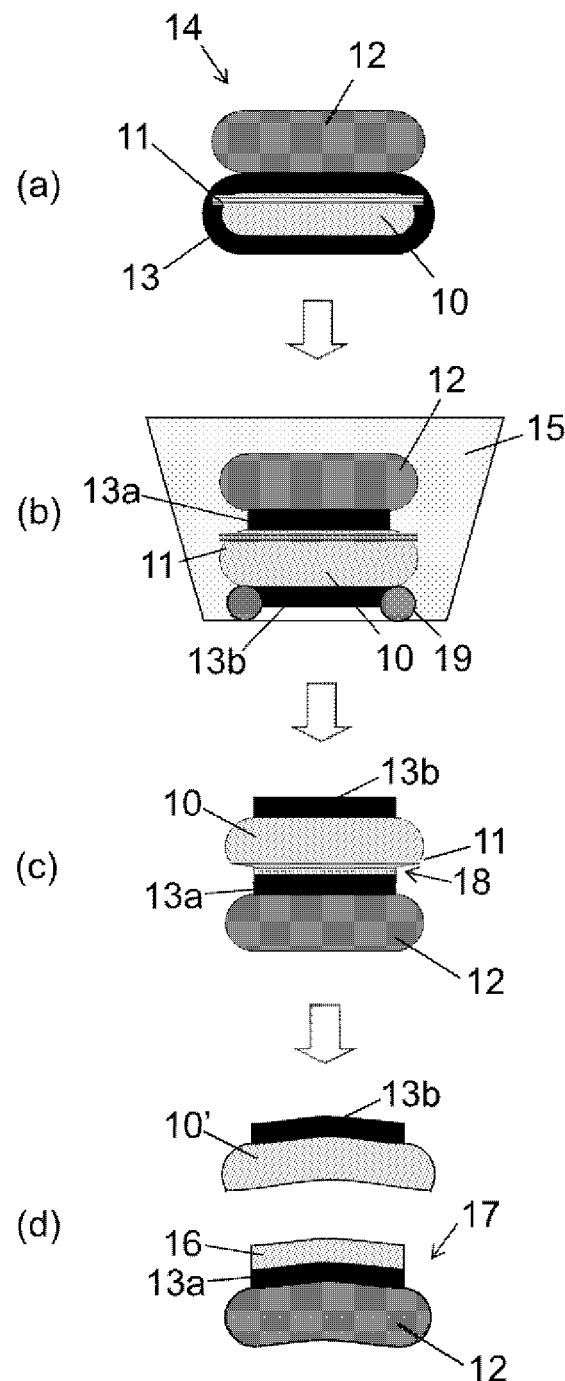
FIG. 1 is a flowchart showing an example of an embodiment of a method for manufacturing an SOI wafer according to the present invention.

The present inventors have conducted a study on a method for suppressing an SOI island that is a characteristic defect produced at the time of manufacturing an SOI wafer by the ion implantation delamination method. As a result, they considered that, when an insulator film placed between a bond wafer and a base wafer is removed from an outer peripheral end toward the center to some extent by etching before delaminating the bond wafer, since a region with low bonding strength that can be a cause of occurrence of the SOI island is no longer present, halfway transfer of an SOI layer can be avoided in a region prone to generation of the SOI island, transfer of the SOI layer can be assuredly prevented from occurring in the corresponding region, thereby avoiding occurrence of the SOI island.

Thus, before delaminating the bond wafer, a bonded wafer must be immersed in an insulator film etchant such as a hydrofluoric acid. In conventional examples, since there is concern that a bonding interface is eroded due to the etchant when the bonding interface is immersed in the etchant while the bonding strength is low, it is considered that a high-temperature (e.g., 1000° C. or more) bonding heat treatment must be conducted before immersing in the etchant as described in, e.g., Japanese Unexamined Patent Application Publication (Kokai) No. H 10-70054.

However, in case of the ion implantation delamination method, since delamination of the bond wafer occurs at an ion implanted layer when such a high-temperature heat treatment is performed before etching, the SOI island cannot be eventually avoided. Thus, the present inventors have examined to what extent etching of a silicon oxide film on the bonding interface proceeds when immersion in the etchant is performed while bonding is effected at a room temperature and discovered that the etching on the bonding interfaces stays at a position that is approximately 10 mm from an outer periphery even if the bonding interface of the silicon oxide film and bare silicon is immersed in a 50% HF containing aqueous solution for one day (24 hours).

However, according to such a method as described in Patent Literature 2, it has been found out, when an insulator film is formed on a bond wafer side and the etching is performed, an SOI wafer after delamination warps. As shown in FIG. 3, in case of bonding a bond wafer 110 having an ion implanted layer 111 and an insulator film 113 formed thereon and a base wafer 112 (FIG. 3(a)), immersing them in an HF containing aqueous solution 115, and etching the insulator film 113 on a bonded interface from an outer peripheral end (FIG. 3(b)), the insulator film on a back surface of the bond wafer 110 is also removed, and a bond wafer having no insulator film on front and back surfaces thereof (a delaminated bond wafer 110') is provided when the bond wafer 110 is delaminated at the ion implanted layer 111, and an SOI wafer 117 having an SOI layer 116 transferred by the delamination is fabricated (FIG. 3(c)).

In this case, the SOI wafer 117 warps in a convex shape on the SOI layer 116 side due to a difference in thermal expansion coefficient between the insulator film and silicon as described above. On the other hand, the delaminated bond wafer 110' having no insulator film on both the front and back surfaces thereof has a flat shape.

When the SOI wafer 117 after delamination warps in the convex shape, a tip portion of the convex shape of the SOI wafer is brought into contact with the bond wafer 110' having the flat shape due to a mismatch of the shapes, and scratches and an abnormality in SOI film thickness distribution is generated on a surface of the SOI layer 116. It is to be noted that, since formation of a natural oxide film is suppressed on a surface of a contact portion of the SOI layer 116 that has been brought into contact with the delaminated bond wafer 110', an etching removal of the SOI layer at this portion becomes slightly large in a subsequent cleaning process of the SOI wafer 117, and hence the abnormality in SOI film thickness distribution is generated.

As a result of keenly examining a method for preventing occurrence of the SOI island at the terrace portion while suppressing generation of the scratches on the SOI wafer after delamination and the abnormality in SOI film thickness distribution, it has been found out that prevention of occurrence of the SOI island and suppression of the scratches and the abnormality in SOI film thickness distribution can be achieved at the same time by a method for etching the insulator film between the bond wafer and the base wafer while protecting the insulator film on a back surface of the bond wafer, thereby bringing the present invention to completion.

Although the present invention will now be described in detail hereinafter as an embodiment with reference to the drawings, the present invention is not restricted thereto.

FIG. 1 is a flowchart of a method for manufacturing an SOI wafer according to the present invention.

First, an insulator film is formed on an entire surface of a bond wafer made of a silicon single crystal. Then, at least one type of gas ion selected from a hydrogen ion and a rare gas ion is ion-implanted into a silicon single crystal bond wafer from the surface thereof to form an ion implanted layer through the insulator film. In the present invention, the insulator film may be formed on the bond wafer alone, or it may be formed on both the bond wafer and a base wafer.

Although the insulator film to be formed is not restricted in particular, an oxide film or a nitride film is general, or a laminated film using these films can be also adopted.

Then, as shown in FIG. 1(a), at a room temperature of, e.g., approximately 20 to 30° C., an ion implanted surface of the bond wafer 10 having the ion implanted layer 11 formed thereon is bonded to a surface of the base wafer 12 through the insulator film 13, thus forming a bonded wafer 14.

Before such bonding, when a plasma treatment is performed with respect to a bonding surface of at least one wafer, bonding strength at the room temperature can be improved.

After such bonding, it is preferable to perform etching that is a next process without effecting a heat treatment or after carrying out a low-temperature heat treatment (e.g., 200 to 350° C.) that does not cause delamination of the bond wafer 10 at the ion implanted layer 11.

As a result, it is possible to avoid delamination of the bond wafer at a stage before bonding that is concerned at the time of using the ion implantation delamination method in the conventional examples, and a terrace width can be more accurately controlled.

Thereafter, as shown in FIG. 1(b), the bonded wafer 14 is brought into contact with a liquid that can dissolve the insulator film or exposed to a gas that can dissolve the insulator film while protecting an insulator film 13b on a back surface of the bond wafer 10 on the opposite side of a bonding surface of the same, and an insulator film 13a placed between the bond wafer 10 and the base wafer 12 is etched from an outer peripheral end of the bonded wafer 14 toward the center.

As an etching method, it is possible to use a method for immersing the bonded wafer 14 in an etchant 15 (a liquid that can dissolve the insulator film) as shown in FIG. 1(b) or a method for exposing the same to vapor that can dissolve the insulator film to perform etching.

When the insulator film 13 is an oxide film, an aqueous solution containing HF is preferable as the etchant 15. Moreover, a buffered hydrofluoric acid, an $HF/H_2O_2/CH_3COOH$ aqueous solution, and $HF/HNO_3$ aqueous solution, or the like can be also applied. Additionally, in case of a nitride film, using a phosphoric acid is preferable.

In regard to protection of the insulator film 13b on the back surface of the bond wafer 10, as shown in FIG. 1(b), ring-shaped rubber (an O-ring 19) may be brought into contact with an entire circumference near an outer periphery of the back surface of the bond wafer 10 and a treatment that blocks the etchant or the etching gas may be carried out, or a protective sheet of, e.g., PVC may be disposed to the upper side of the insulator film 13b on the back surface of the bond wafer 10.

Such etching causes the insulator film 13a placed between the bond wafer 10 and the base wafer 12 to be eroded from an outer peripheral end thereof. When the insulator 13a is eroded, since the bond wafer 10 and the base wafer 12 are not bonded in this eroded portion, transference of the SOI layer does not occur in the eroded portion at the time of delaminating the bond wafer 10, and this portion turns to a terrace portion. On the other hand, in a region where the insulator film 13a remains, the SOI layer is transferred in a subsequent delamination process. That is, an erosion width provided by the etching becomes a terrace width. On the other hand, since the insulator film 13b on the back surface of the bond wafer 10 is protected by the O-ring 19 or the like, etching does not occur.

Figure 2:
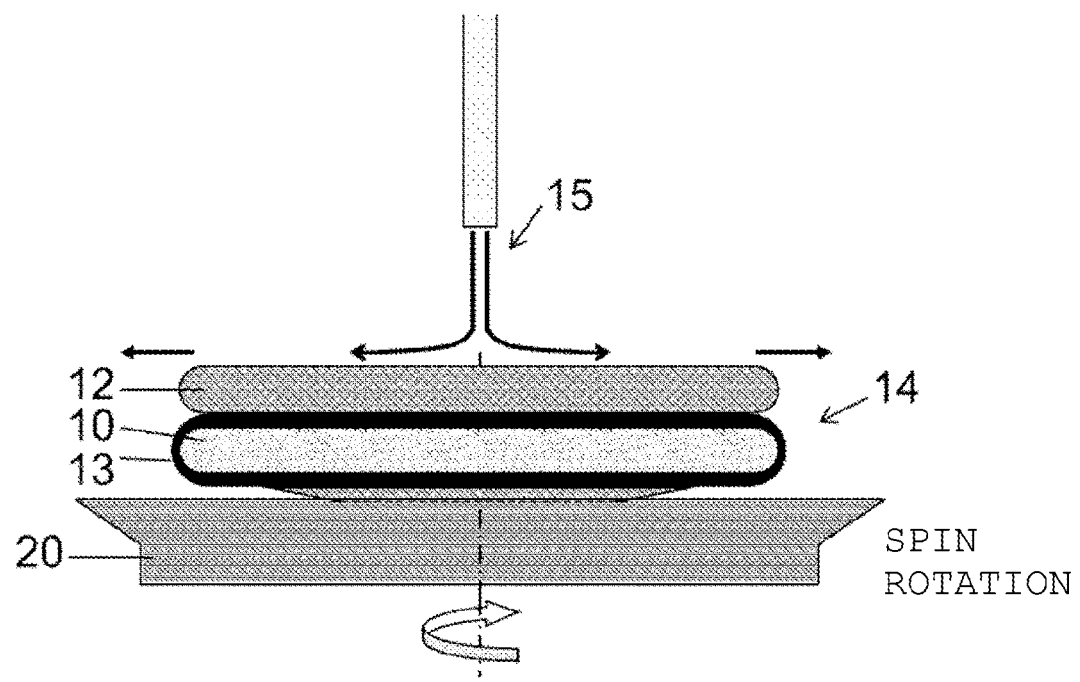
FIG. 2 is a schematic view showing another example of an etching step in the method for manufacturing an SOI wafer according to the present invention.

Further, as another method for performing etching while protecting the insulator film on the back surface of the bond wafer 10, there is such spin etching as shown in FIG. 2. As shown in FIG. 2, when the back surface of the bond wafer 10 is adsorbed to an adsorption table 20, the insulator film on the back surface portion in the insulator film 13 formed on the entire surface of the bond wafer 10 can be protected. In a state that the bonded wafer 14 is horizontally rotated, a non-etching gas may be supplied to the back surface side of the bond wafer 10 while supplying the etchant 15 or the etching gas from the upper side of the base wafer 12 so that the etchant 15 or the etching gas cannot come around to the back surface of the bond wafer 10 due to centrifugal force caused by rotation of the bonded wafer 14 or a wind pressure of the non-etching gas.

In case of performing such etching, there is concern that the etchant does not reach the oxide film on the interface of the bond wafer and the base wafer due to an influence of the centrifugal force acting on the etchant, but appropriately adjusting a rotating velocity of the wafer or a flow volume of the etchant or a flow volume of the etching gas enables etching the insulator film placed between the bond wafer 10 and the base wafer 12 from the outer peripheral end thereof.

Meanwhile, the SOI island is generated at a boundary portion between the SOI layer and the terrace portion. This boundary portion is a region where the bonding strength is low due to poor flatness at the outer peripheral portion of the wafer to be bonded and the SOI layer is only partially transferred. To prevent generation of the SOI island, when the erosion width of the insulator film 13a is expanded to the region where the SOI island is generated by such etching of the insulator film 13a as shown in FIG. 1(b) and the etching is performed until it reaches a region where the bonding strength is low so that transference of the SOI layer does not occur in this region, the SOI island is not assuredly generated.

Although the erosion width from the outer periphery of the insulator film 13a in the etching varies depending on a type of the insulator film or a type/concentration/temperature of the etchant or the etching gas, the erosion width can be controlled by an etching time under the same conditions, and hence a terrace width after transference of the SOI layer can be controlled by adjusting these conditions.

It is preferable to carry out such etching of the insulator film 13a until it reaches a position that is 0.3 mm to 10 mm from the outer peripheral end of the bonded wafer 14 toward the center.

When the adjustment is performed to provide such an erosion width, the region prone to generation of the SOI island can be removed by the etching, the terrace width can be controlled, and generation of the SOI island can be assuredly prevented. At this time, chamfered portions each having a width of approximately hundreds of µm are generally formed at the outer peripheral end portions of the bond wafer 10 and the base wafer 12 that form the bonded wafer 14, setting the erosion width to 0.5 mm or more is preferable since these portions are not bonded and the SOI island is not produced in these portions, and setting this width to 3 mm or less is further preferable while considering an effective area of the SOI layer.

Furthermore, a protection range of the back surface of the bond wafer 10 is not restricted in particular. To assuredly warp the bond wafer after delamination in a direction (a delamination surface has a concave shape) opposite to the SOI wafer, a region on the inner side that is approximately several mm from the outer periphery is desirable as the protection range, but protection may be carried out in a further inner range depending on a level of allowable warp. In case of a wafer having a diameter of 300 mm, it is preferable to set the protection range to, e.g., a region inside a position that is 0 mm to 75 mm from the outer peripheral end of the bond wafer 10 toward the center. This protection range can be adjusted by installing, e.g., the O-ring 19 at a position that is 0 mm to 75 mm from the outer peripheral end of the bond wafer 10 toward the center.

When the insulator film in such a range is protected and left, the bond wafer after delamination can be further assuredly warped in the concave shape.

Then, as shown in FIG. 1(c), it is also preferable to immerse the bonded wafer 14 having the insulator film 13a subjected to the etching in a liquid that can dissolve a silicon single crystal or expose the same to a gas that can dissolve the silicon single crystal, thereby etching an outer peripheral portion 18 until it reaches at least a depth of the ion implanted layer 11 from the bonding surface side of the bond wafer 10.

When the outer peripheral portion of the bond wafer is subjected to Si etching in this manner, a portion that can be a foreign matter in the device fabrication process can be removed in advance. As a result, generation of the SOI island can be assuredly avoided. Moreover, since the ion implanted layer of the bond wafer outer peripheral portion 18 is removed, even if a heat treatment is added in a subsequent process, blistering (a phenomenon that blisters are caused) at the outer peripheral portion does not occur. Therefore, Si dust produced due to this blistering can be prevented from adhering to the terrace portion of the SOI wafer. It is to be noted that, since the adhering Si dust is not coupled with the base wafer like the SOI island, it can be removed by general cleaning to some extent, but complete removal is difficult, and hence suppressing adhesion of the Si dust by the above-described Si etching of the outer peripheral portion as much as possible is desirable.

As the liquid that can dissolve the silicon single crystal, there is, e.g., a TMAH (tetramethylammonium hydroxide) aqueous solution, but the present invention is not restricted thereto as long as it is a liquid that can dissolve the silicon single crystal or a gas that can dissolve the silicon single crystal.

Further, before performing such Si etching, it is preferable to effect masking and protection in advance so that the outer peripheries of the bond wafer 10 and the base wafer 12 outside the range where the Si etching is performed cannot be unnecessarily etched.

Then, as shown in FIG. 1(d), part of the bond wafer 10 is delaminated at the ion implanted layer 11 by a delamination heat treatment at, e.g., 400° C. or more (the bond wafer 10' after delamination) to fabricate an SOI wafer 17 having an SOI layer 16 formed on the insulator film 13a (a buried insulator film).

At this time, in the present invention, the delamination surface of the bond wafer is warped in the concave shape, and contact due to such a mismatch of shapes as observed in the conventional examples can be avoided.

As described above, according to the present invention, the width of the terrace portion can be controlled to avoid generation of the SOI island, and scratches and an abnormality in SOI film thickness distribution caused by contact due to a mismatch after delamination can be suppressed, and the high-quality SOI wafer can be manufactured.

EXAMPLES

Although the present invention will now be more specifically described hereinafter based on examples and comparative examples, the present invention is not restricted thereto.

Example 1

Hydrogen ions were implanted into a bond wafer having a thermal oxide film of 150 nm formed on an entire surface of a silicon single crystal wafer having a diameter of 300 mm under ion implantation conditions in the following Table 1, this wafer was bonded to a base wafer formed of a silicon single crystal wafer having a diameter of 300 mm (a step in FIG. 1(a)), an HF treatment (immersion in a 50% HF aqueous solution) was performed while protecting the oxide film on a back surface of the bond wafer with an O-ring as shown in FIG. 1 after bonding (a step in FIG. 1(b)), and then a delamination heat treatment was carried out to effect delamination, thereby fabricating an SOI wafer (a step in FIG. 1(d)).

Example 2

An SOI wafer was fabricated like Example 1 except that an oxide film on a back surface was protected in a range from the wafer center to a position that is 5 mm from an outer periphery in an HF treatment and an Si etching process (a step in FIG. 1(c)) for a bond wafer outer peripheral portion using a TMAH aqueous solution was added after the HF treatment.

Comparative Example 1

A bond wafer having a thermal oxide film and a base wafer that are the same as Example 1 were prepared, both the wafers were bonded (a step in FIG. 3(a)), and then a delamination heat treatment was performed without carrying out the HF treatment to delaminate the bond wafer (a step in FIG. 3(c)), thereby fabricating an SOI wafer.

Comparative Example 2

An SOI wafer was fabricated in the same manner as Comparative Example 1 except that the HF treatment was performed without protecting an oxide film on a back surface of a bond wafer after bonding the bond wafer to a base wafer (a step in FIG. 3(b)) and then the delamination heat treatment was performed to delaminate the bond wafer.

Table 1 shows conditions of Examples 1 and 2 and Comparative Examples 1 and 2 and evaluation results thereof.

It is to be noted that scratches were observed by visual observation under a collimated light. Further, as observation of an SOI film thickness distribution, measurement was carried out using an optical film thickness measuring instrument (Acumap manufactured by ADE).

TABLE 1

|  | Example 1 | Example 2 | Comparative Example 1 | Comparative Example 2 |
|---|---|---|---|---|
| Thermal oxide film thickness (bond wafer) | 150 nm | 150 nm | 150 nm | 150 nm |
| Ion implantation (bond wafer) | 40 keV, $6 \times 10^{16}$ cm$^{-2}$ | 40 keV, $6 \times 10^{16}$ cm$^{-2}$ | 40 keV, $6 \times 10^{16}$ cm$^{-2}$ | 40 keV, $6 \times 10^{16}$ cm$^{-2}$ |
| Bonding process | Room temperature | Room temperature | Room temperature | Room temperature |
| HF treatment (50% HF aqueous solution) | 10 min (oxide film on back surface is protected in range from wafer center to 3 mm at outer periphery) | 10 min (oxide film on back surface is protected in range from wafer center to 5 mm at outer periphery) | Nil | 10 min (oxide film on back surface is not protected) |
| Si etching | Nil | Si at outer peripheral portion of bond wafer is etched 2 μm with use of TMAH aqueous solution | Nil | Nil |
| Delamination heat treatment/delamination | 500° C. 30 min | 500° C. 30 min | 500° C. 30 min | 500° C. 30 min |
| Oxide film on back surface of bond wafer | Present | Present | Present | Absent |
| Scratches | Absent | Absent | Absent | Present |
| Abnormality in SOI film thickness distribution | Absent | Absent | Absent | Present |
| Observation of terrace after delamination (optical microscope) | Terrace width: 1.1 mm SOI island: absent | Terrace width: 1.1 mm SOI island: absent | Terrace width: 1.0 mm SOI island: present | Terrace width: 1.1 mm SOI island: absent |

As shown in Table 1, in Examples 1 and 2, etching according to the present invention enabled avoiding generation of an SOI island, and scratches and an abnormality in SOI film thickness distribution was suppressed by leaving the oxide film on the back surface of the bond wafer. On the other hand, the SOI island was detected in Comparative Example 1 where the HF treatment was not carried out, whereas scratches were observed at a central portion of the wafer and a portion where a film thickness of the SOI layer was drastically thinner than that in the periphery was observed in a region of several $cm^2$ at the central portion of the wafer in Comparative Example 2 where the HF treatment was performed without protecting the oxide film on the back surface of the bond wafer.

It is to be noted that the present invention is not restricted to the foregoing embodiment. The foregoing embodiment is an illustrative example, and any example that has substantially the same configuration and exercises the same functions and effects as the technical concept described in claims of the present invention is included in the technical scope of the present invention.

The invention claimed is:

1. A method for manufacturing an SOI wafer, by which at least one type of gas ion selected from a hydrogen ion and a rare gas ion is ion-implanted into a silicon single crystal bond wafer from a surface thereof to form an ion implanted layer, an ion implanted surface of the bond wafer is bonded to a surface of a base wafer through an insulator film, and then the bond wafer is delaminated at the ion implanted layer to fabricate an SOI wafer, wherein the method comprises a step of forming the insulator film on at least an entire surface of the bond wafer before the bonding, bringing a bonded wafer before delaminating the bond wafer at the ion implanted layer into contact with a liquid that enables dissolving the insulator film or exposing the same to a gas that enables dissolving the insulator film while protecting the insulator film on a back side of a bonding surface of the bond wafer, and thus etching the insulator film placed between the bond wafer and the base wafer from an outer peripheral end of the bonded wafer toward a center of the bonded wafer, and the insulator film on the back side of the bonding surface of the bond wafer is protected by using an O-ring.

2. The method for manufacturing an SOI wafer according to claim 1, wherein the bond wafer and the base wafer are bonded at a room temperature, and then the insulator film is etched without performing a heat treatment.

3. The method for manufacturing an SOI wafer according to claim 2, wherein the insulator film is etched until it reaches a position that is 0.3 mm to 10 mm from the outer peripheral end of the bonded wafer toward the center.

4. The method for manufacturing an SOI wafer according to claim 3, wherein a range where the insulator film on the back side of the bonding surface of the bond wafer is protected in the etching of the insulator film is a region inside a position that is 0 mm to 75 mm from the outer peripheral end of the bond wafer toward the center.

5. The method for manufacturing an SOI wafer according to claim 1, wherein the bond wafer and the base wafer are bonded at a room temperature, then a low-temperature heat treatment that does not allow delamination at the ion implanted layer is carried out, and thereafter the insulator film is etched.

6. The method for manufacturing an SOI wafer according to claim 5, wherein the insulator film is etched until it reaches a position that is 0.3 mm to 10 mm from the outer peripheral end of the bonded wafer toward the center.

7. The method for manufacturing an SOI wafer according to claim 6, wherein a range where the insulator film on the back side of the bonding surface of the bond wafer is protected in the etching of the insulator film is a region inside a position that is 0 mm to 75 mm from the outer peripheral end of the bond wafer toward the center.

8. The method for manufacturing an SOI wafer according to claim 1, wherein the insulator film is etched until it reaches a position that is 0.3 mm to 10 mm from the outer peripheral end of the bonded wafer toward the center.

9. The method for manufacturing an SOI wafer according to claim 1, wherein a range where the insulator film on the back side of the bonding surface of the bond wafer is protected in the etching of the insulator film is a region inside a position that is 0 mm to 75 mm from the outer peripheral end of the bond wafer toward the center.

10. The method for manufacturing an SOI wafer according to claim 1, wherein the insulator film is an oxide film, a nitride film, or a laminated film of these films.

11. The method for manufacturing an SOI wafer according to claim 1, wherein the bonded wafer having the insulator film subjected to etching is immersed in a liquid that enables dissolving single crystal silicon or exposed to a gas that enables dissolving the single crystal silicon, an outer peripheral portion of the bond wafer is thereby etched to at least a depth of the ion implanted layer from the bonding surface side of the bond wafer, and then the bond wafer is delaminated.

* * * * *